US012604718B2

(12) United States Patent
Kim et al.

(10) Patent No.: US 12,604,718 B2
(45) Date of Patent: Apr. 14, 2026

(54) MEMORY DEVICE AND METHOD OF MANUFACTURING THE SAME

(71) Applicant: SK hynix Inc., Icheon-si (KR)

(72) Inventors: Dae Hyun Kim, Icheon-si (KR); Sei Yon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 757 days.

(21) Appl. No.: 17/882,370

(22) Filed: Aug. 5, 2022

(65) Prior Publication Data

US 2023/0290729 A1     Sep. 14, 2023

(30) Foreign Application Priority Data

Mar. 10, 2022     (KR) ......................... 10-2022-0030223

(51) Int. Cl.
H10B 43/27          (2023.01)
H01L 23/535          (2006.01)

(52) U.S. Cl.
CPC ........... H01L 23/535 (2013.01); H10B 43/27 (2023.02)

(58) Field of Classification Search
CPC ........ H10B 41/20; H10B 41/27; H10B 43/20; H10B 43/27; H10B 51/20; H10B 63/84
See application file for complete search history.

(56) References Cited

U.S. PATENT DOCUMENTS

2017/0125436 A1*    5/2017    Sharangpani ..... H01L 21/02178
2017/0243919 A1*    8/2017    Seong .................. H10N 70/828

FOREIGN PATENT DOCUMENTS

KR          1020160133626 A      11/2016
KR          101916222 B1      11/2018

* cited by examiner

*Primary Examiner* — Tucker J Wright
(74) *Attorney, Agent, or Firm* — WILLIAM PARK AND ASSOCIATES LTD.

(57)          ABSTRACT

Provided herein may be a memory device and a method of manufacturing the same. The memory device may include a plurality of insulating layers and a plurality of gate lines configured to be alternately stacked, and a cell plug configured to pass through the plurality of insulating layers and the plurality of gate lines, wherein the plurality of gate lines, each made of a conductive material, are etched together with the plurality of insulating layers, and the cell plug includes a blocking layer, a charge trap layer, a tunnel insulating layer, a channel layer, and a core pillar.

6 Claims, 16 Drawing Sheets

1

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2022-0030223 filed on Mar. 10, 2022, in the Korean Intellectual Property Office, the entire disclosure of which is incorporated by reference herein.

BACKGROUND

1. Technical Field

Various embodiments of the present disclosure relate to a memory device and a method of manufacturing the memory device, and more particularly to a three-dimensional (3D) memory device and a method of manufacturing the 3D memory device.

2. Related Art

Memory devices may be classified into a volatile memory device in which stored data is lost when the supply of power is interrupted and a nonvolatile memory device in which stored data is retained even when the supply of power is interrupted.

Examples of the nonvolatile memory device may include a NAND flash memory, a NOR flash memory, a resistive memory (or a resistive random access memory: ReRAM), a phase-change memory (PRAM), a magnetoresistive random access memory (MRAM), a ferroelectric random access memory (FRAM), a spin transfer torque random access memory (STT-RAM), etc.

Among the examples of the nonvolatile memory devices, a nonvolatile memory device that is formed to have a 3D structure may include cell plugs passing through insulating layers and gate lines. In order to form a memory block including cell plugs, the step of alternately stacking insulating layers and sacrificial layers on a lower structure, the step of forming a plurality of cell plugs passing through the insulating layers and the sacrificial layers, the step of forming a slit or a trench configured to separate memory blocks, the step of removing sacrificial layers exposed through the slit or the trench, and the step of filling an area from which the sacrificial layers are removed with a conductive material for gate lines may be performed.

However, with the increase in the degree of integration of a memory device, the level of difficulty in the step of removing the sacrificial layers and filling an area from which the sacrificial layers are removed with a conductive material may increase.

SUMMARY

An embodiment of the present disclosure may provide for a memory device. The memory device may include a plurality of insulating layers and a plurality of gate lines configured to be alternately stacked, and a cell plug configured to pass through the plurality of insulating layers and the plurality of gate lines, wherein the plurality of gate lines, each made of a conductive material, are etched together with the plurality of insulating layers, and the cell plug includes a blocking layer, a charge trap layer, a tunnel insulating layer, a channel layer, and a core pillar.

An embodiment of the present disclosure may provide for a method of manufacturing a memory device. The method may include alternately stacking a plurality of gate lines and a plurality of insulating layers on a lower structure in which a cell region and a slim region are defined, forming a vertical hole configured to pass through the plurality of gate lines and the plurality of insulating layers in the cell region, forming a blocking layer along an inner wall of the vertical hole, forming a charge trap layer along an inner wall of the blocking layer, forming a tunnel insulating layer along an inner wall of the charge trap layer, forming a channel layer along an inner wall of the tunnel insulating layer, and forming a core pillar in a region enclosed with the channel layer.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms and should not be construed as being limited to the embodiments described in the specification or application.

Various embodiments of the present disclosure are directed to a memory device and a method of manufacturing the memory device, which may lower the level of difficulty in a process for manufacturing the memory device and simplify the manufacturing process.

Figure 1:
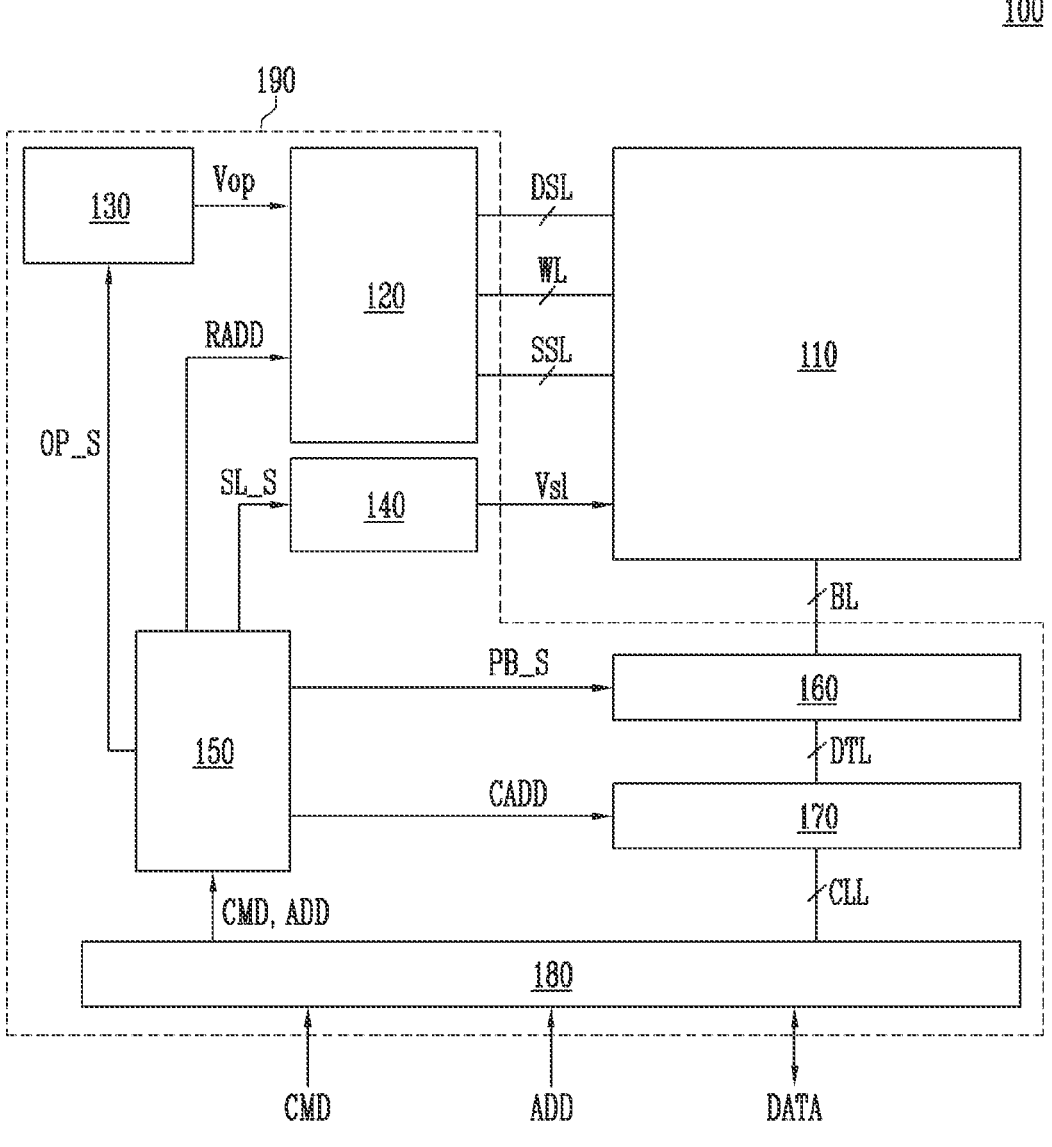
FIG. 1 is a diagram illustrating a memory device according to an embodiment of the present disclosure.

FIG. 1 is a diagram illustrating a memory device according to an embodiment of the present disclosure.

Referring to FIG. 1, a memory device 100 may include a peripheral circuit 190 and a memory cell array 110.

The peripheral circuit 190 may perform a program operation of storing data in the memory cell array 110 and a verify operation, perform a read operation of outputting data that is stored in the memory cell array 110, or perform an erase operation of erasing data that is stored in the memory cell array 110. The peripheral circuit 190 may include a voltage generation circuit 130, a row decoder 120, a source line driver 140, a control circuit 150, a page buffer 160, a column decoder 170, and an input-output circuit 180.

The memory cell array 110 may include a plurality of memory cells in which data is stored. In an embodiment, the memory cell array 110 may include a three-dimensional (3D) memory cell array. Each of the plurality of memory cells may store single-bit data or multi-bit data of two or more bits depending on the program scheme. The plurality of memory cells may form a plurality of strings. The plurality of memory cells that are included in each of the strings may be electrically connected to each other through a channel. Channels that are included in the strings may be coupled to the page buffer 160 through bit lines BL.

The row decoder 120 may be coupled to the memory cell array 110 through a plurality of drain select lines DSL, a plurality of word lines WL, and a plurality of source select lines SSL. The row decoder 120 may transfer operating voltages Vop to the plurality of drain select lines DSL, the plurality of word lines WL, and the plurality of source select lines SSL in response to a row address RADD.

The voltage generation circuit 130 may generate various operating voltages Vop to be used for a program operation, a read operation, or an erase operation in response to an operation signal OP_S. For example, the voltage generation circuit 130 may selectively generate and output operating voltages Vop that include a program voltage, a verify voltage, a pass voltage, a read voltage, an erase voltage, etc.

The source line driver 140 may transmit a source voltage Vsl to the memory cell array 110 in response to a source line control signal SL_S. For example, the source voltage Vsl may be transferred to a source line coupled to the memory cell array.

The control circuit 150 may output the operation signal OPS, the row address RADD, the source line control signal SL_S, a page buffer control signal PB_S, and a column address CADD in response to a command CMD and an address ADD.

The page buffer 160 may be coupled to the memory cell array 110 through the bit lines BL. The page buffer 160 may temporarily store data DATA that is received through the plurality of bits lines BL in response to the page buffer control signal PB_S. The page buffer 160 may sense the voltages or currents of the bit lines BL during a read operation.

In response to the column address CADD, the column decoder 170 may transmit data DATA, received from the input-output circuit 180, to the page buffer 160 or transmit data DATA, stored in the page buffer 160, to the input-output circuit 180. The column decoder 170 may exchange the data DATA with the input-output circuit 180 through column lines CLL and may exchange data DATA with the page buffer 160 through data lines DTL.

The input-output circuit 180 may transfer a command CMD and an address ADD, received from an external device (e.g., a controller) that is coupled to the memory device 100, to the control circuit 150 and may output data, received from the column decoder 170, to the external device.

Figure 2:
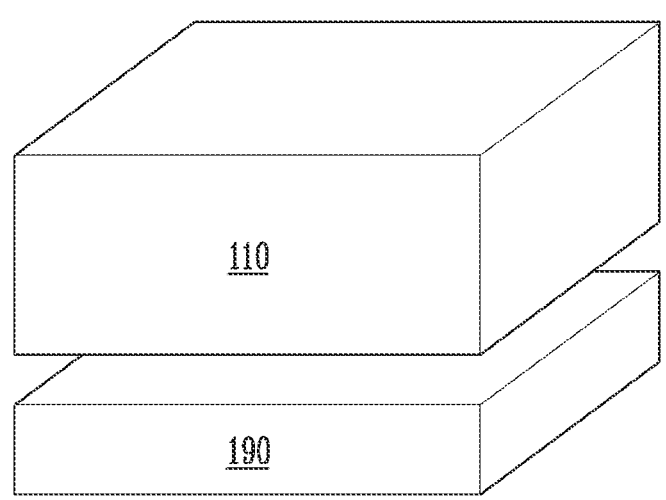
FIG. 2 is a diagram illustrating the arrangement structure of a memory cell array and a peripheral circuit.
Figure 2:
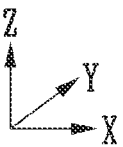

FIG. 2 is a diagram illustrating the arrangement structure of a memory cell array and a peripheral circuit.

Referring to FIG. 2, the memory cell array 110 may be stacked on the peripheral circuit 190 in a memory device having a 3D structure. For example, when a substrate forms an X-Y plane, the peripheral circuit 190 may be stacked in a Z direction from the substrate, and the memory cell array 110 may be stacked on the peripheral circuit 190. The memory cell array 110 and the peripheral circuit 190 may be coupled to each other through a slim region of the memory cell array 110. For example, contacts for electrically connecting gate lines that are included in the memory cell array 110 to transistors of the peripheral circuit 190 may be formed in the slim region.

Figure 3:
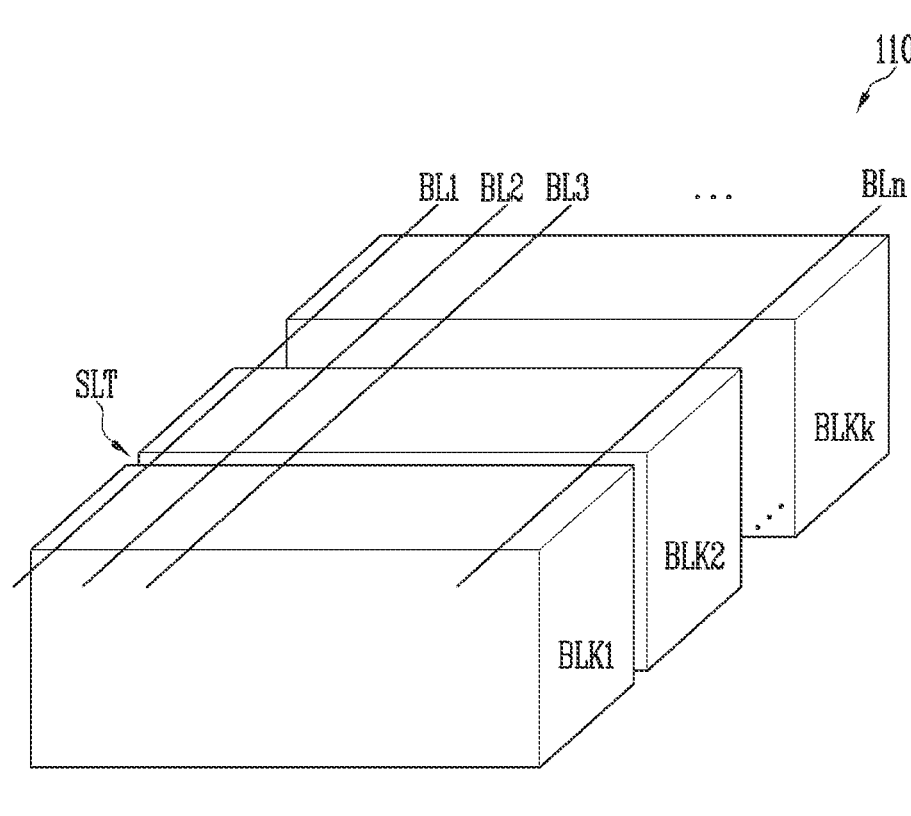
FIG. 3 is a diagram illustrating the structure of a memory cell array.
Figure 3:
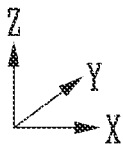

FIG. 3 is a diagram illustrating the structure of a memory cell array.

Referring to FIG. 3, the memory cell array 110 may include first to k-th memory blocks BLK1 to BLKk (where k is a positive integer). The first to k-th memory blocks BLK1 to BLKk may be arranged while being spaced apart from each other in a Y direction and may be coupled in common to the first to n-th bit lines BL1 to BLn. For example, the first to n-th bit lines BL1 to BLn may extend in the Y direction and may be arranged to be spaced apart from each other in an X direction. The first to k-th memory blocks BLK1 to BLKk may be separated from each other through slits SLT. The first to k-th memory blocks BLK1 to BLKk may include cell plugs (not illustrated) that extend in the Z direction. Each of the cell plugs may include a plurality of memory cells in which data can be stored. The structure of the memory block including the cell plugs will be described in detail below.

Figure 4:
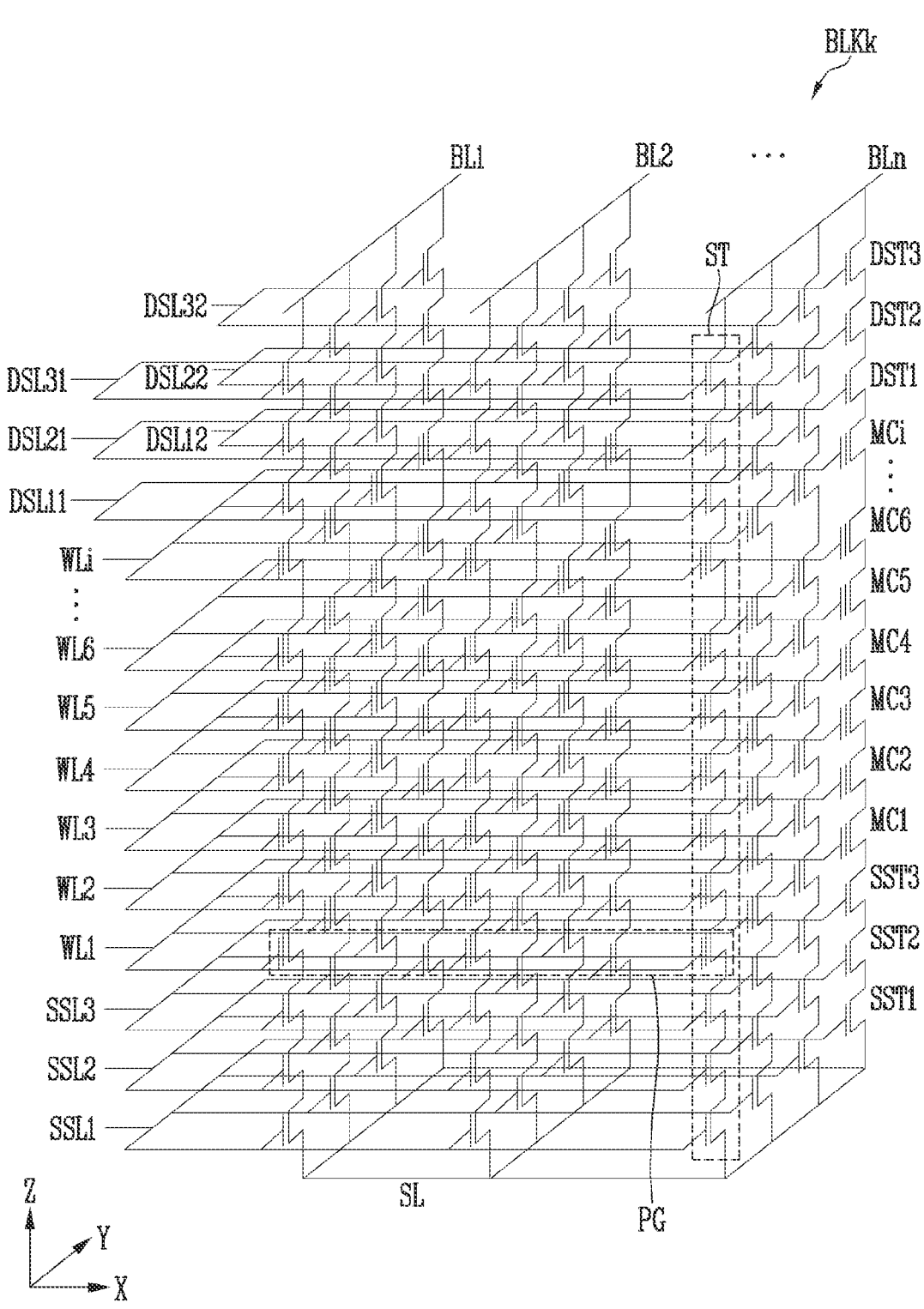
FIG. 4 is a diagram illustrating the structure of a memory block.

FIG. 4 is a diagram illustrating the structure of the memory block.

Referring to FIG. 4, first to k-th memory blocks (e.g., BLK1 to BLKk of FIG. 3) are configured in the same manner, and thus, the k-th memory block BLKk, among the memory blocks, is illustrated by way of example.

The k-th memory block BLKk may include strings ST that are coupled between first to n-th bit lines BL1 to BLn and a source line SL. Since the first to n-th bit lines BL1 to BLn extend in a second direction (e.g., a Y direction) and are arranged to be spaced apart from each other in a first direction (e.g., an X direction), the strings ST may also be arranged to be spaced apart from each other in the first and second directions (e.g., X and Y directions). For example, strings ST may be arranged between the first bit line BL1 and the source line SL, and strings ST may be arranged between the second bit line BL2 and the source line SL. In this way, strings ST may be arranged between the n-th bit line BLn and the source line SL. The strings ST may extend in a third direction (e.g., a Z direction).

Any one of the strings ST that is coupled to the n-th bit line BLn will be described below by way of example. In detail, the string ST may include first to third source select transistors SST1 to SST3, first to i-th memory cells MC1 to MCi, and first to third drain select transistors DST1 to DST3. Since the k-th memory block BLKk, illustrated in FIG. 4, is illustrated for better understanding of the structure of the memory block, the number of source select transistors, memory cells, and drain select transistors, included in each string ST, may be changed according to the memory device.

Gates of the first to third source select transistors SST1 to SST3 that are included in different strings ST may be coupled to first to third source select lines SSL1 to SSL3, respectively, gates of the first to i-th memory cells MC1 to MCi may be coupled to first to i-th word lines WL1 to WLi, respectively, and gates of the first to third drain select transistors DST1 to DST3 may be coupled to 11th, 12th, 21st, 22nd, 31st, and 32nd drain select lines DSL11, DSL12, DSL21, DSL22, DSL31, and DSL32, respectively.

For example, the first source select line SSL1 may be coupled, in common, to first source select transistors SST1 that are arranged at the same distance from a substrate. In other words, the first source select transistors SST1 that are formed on the same layer may be coupled, in common, to the first source select line SSL1. In this way, the second source select transistors SST2 that are formed on a layer that is different from that of the first source select transistors SST1 may be coupled, in common, to the second source select line SSL2, and the third source select transistors SST3 that are formed on a layer that is different from that of the second source select transistors SST2 may be coupled, in common, to the third source select line SSL3. The first to third source select lines SSL1 to SSL3 may be formed on different layers, respectively.

In the above-described manner, the i-th memory cells MCi that are formed on the same layer may be coupled in common to the i-th word line WLi, and the first to i-th word lines WL1 to WLi may be formed on different layers, respectively. A group of memory cells that are included in different strings ST and coupled to the same word line may be a page (PG).

The first to third drain select transistors DST1 to DST3 that are included in different strings ST may be coupled to drain select lines that are separated from each other. In detail, the first to third drain select transistors DST1 to DST3 that are arranged in the first direction (e.g., X direction) may be coupled to the same drain select lines, respectively, and the first to third drain select transistors DST1 to DST3 that are arranged in the second direction (e.g., Y direction) may be coupled to drain select lines separated from each other. For example, some of the first drain select transistors DST1 may be coupled to the 11th drain select line DSL11, and the remaining first drain select transistors DST1 may be coupled to the 12th drain select line DSL12. The 12th drain select line DSL12 may be a line that is separated from the 11th drain select line DSL11. Therefore, a voltage that is applied to the 11th drain select line DSL11 may be different from a voltage that is applied to the 12th drain select line DSL12. In this way, some of the second drain select transistors DST2 may be coupled to the 21st drain select line DSL21, and the remaining second drain select transistors DST2 may be coupled to the 22nd drain select line DSL22. Some of the third drain select transistors DST3 may be coupled to the 31st drain select line DSL31, and the remaining third drain select transistors DST3 may be coupled to the 32nd drain select line DSL32.

Figure 5:
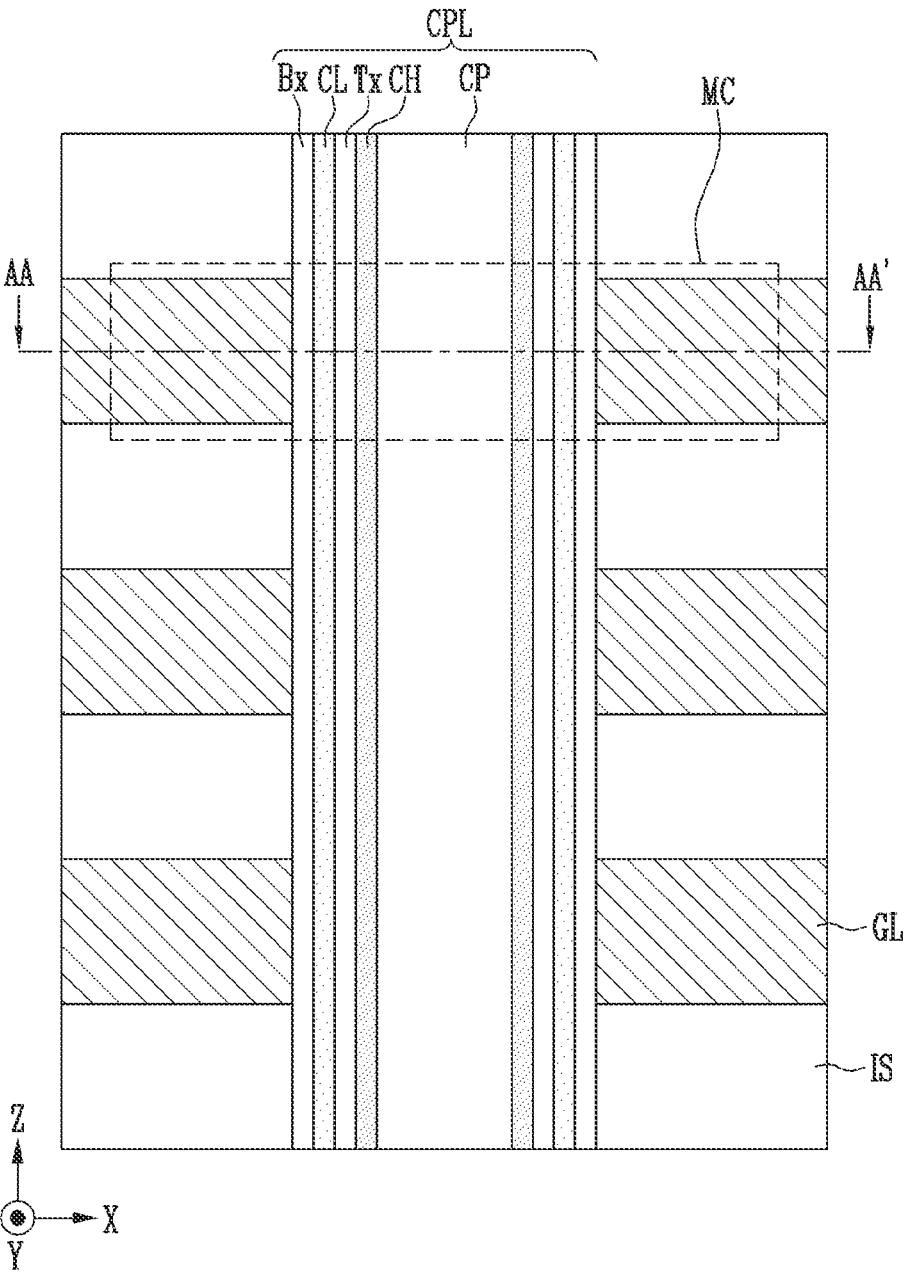
FIG. 5 is a sectional view illustrating the structure of a memory device according to a first embodiment of the present disclosure.

FIG. 5 is a sectional view illustrating the structure of a memory device according to a first embodiment of the present disclosure.

Referring to FIG. 5, the memory block that is included in the memory device may include insulating layers IS and gate lines GL that are alternately stacked and may further include a cell plug CPL passing through the insulating layers IS and the gate lines GL in a vertical direction (e.g., a Z direction).

The insulating layers IS, the gate lines GL, and the cell plug CPL may be formed on a lower structure (not illustrated). For example, the insulating layers IS and the gate lines GL may be alternately stacked on the lower structure (not illustrated). The lower structure may be a substrate, a peripheral circuit, or a source line. Each of the insulating layers IS may be formed of an oxide layer or a silicon oxide layer. The gate lines GL may be used as source select lines, word lines, or drain select lines and may be made of a conductive insulating material. The conductive insulating material may be a material in which a conductive material and an insulating material are mixed with each other and may be a material that has an etch selectivity that is similar to that of the insulating layers IS and through which current can flow. The materials having a similar etch selectivity denote materials that are etched by using the same etch gas. For example, each of the gate lines GL may be made of at least one of materials, such as $Al_xO_y$, $Cr_xO_y$, $Fe_xO_y$, $In_xSn_yO_z$, $In_xO_y$, $La_xAl_yO_z$, $La_xMn_yO_z$, $Re_xO_y$, $Re_xO_y$, $Sn_xO_y$, $Sr_xTi_yO_z$, $Sn_xO_y$, $Ti_xO_y$, $V_xO_y$, and $Zn_xO_y$. Here, because x, y, and z denote the number of atoms of an element in a chemical formula, the values of x, y, and z of one chemical formula may be different from the values of x, y, and z of another chemical formula. For example, each gate line GL may be made of at least one of materials, such as $Al_2O_3$, $CrO_2$, $Fe_3O_4$, InSnO, $In_2O_3$, $LaAlO_3$, $LaMnO_3$, $ReO_2$, $ReO_3$, SnO, $SrTiO_3$, $SnO_2$, $TiO_2$, $Ti_2O_3$, VO, $V_2O_3$, and ZnO. In addition, each gate line GL may be formed of various kinds of conductive oxide layers.

The cell plug CPL may include a blocking layer Bx, a charge trap layer CL, a tunnel insulating layer Tx, a channel layer CH, and a core pillar CP. The blocking layer Bx may be formed in the shape of a cylinder that passes through the insulating layers IS and the gate lines GL and may be made of an insulating material. For example, the blocking layer Bx may be formed of an oxide layer or a silicon oxide layer. The charge trap layer CL may be a layer for trapping electrons, and may be formed in the shape of a cylinder along an inner wall of the blocking layer Bx. For example, the charge trap layer CL may be formed of a nitride layer. The tunnel insulating layer Tx may be formed in the shape of a cylinder along an inner wall of the charge trap layer CL and may be formed of an oxide layer or a silicon oxide layer. The channel layer CH may be formed in the shape of a cylinder along an inner wall of the tunnel insulating layer Tx and may be formed of a nitride layer. The core pillar CP may be formed in the shape of a cylinder enclosed with the channel layer CH and may be made of an insulating material or a conductive material.

A memory cell MC may be a structure in an area in which the corresponding gate line GL and the cell plug CPL overlap each other. For example, among regions forming the cell plug CPL, a region which passes through areas in which the insulating layers IS are formed may be a drain or a source between the memory cells MC, and a region that passes through areas in which the gate lines GL are formed may be the memory cell MC. The structure of the memory cell MC will be described in detail below.

Figure 6:
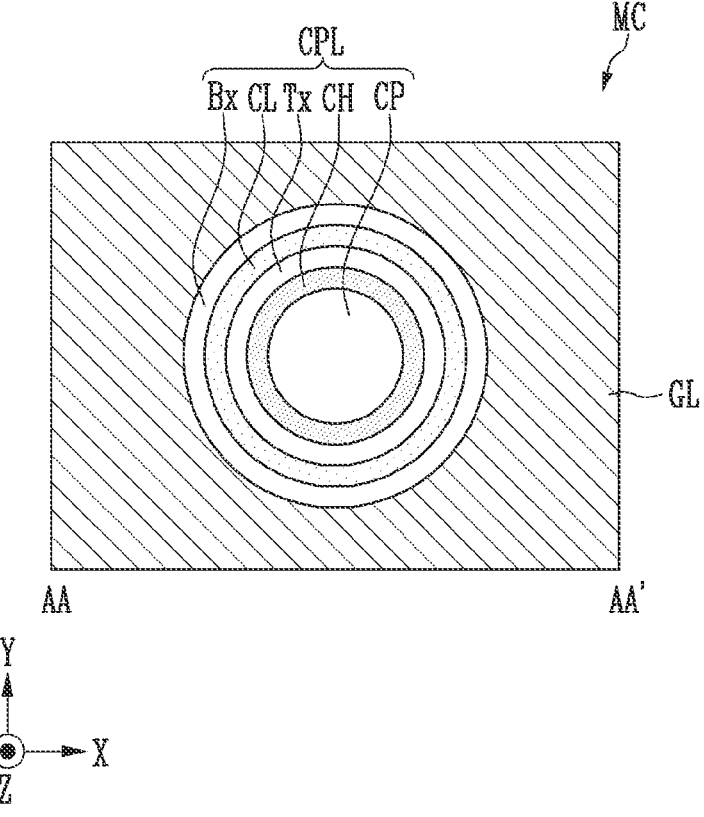
FIG. 6 is a plan view illustrating a section taken along line AA-AA' of a structure illustrated in FIG. 5.

FIG. 6 is a plan view illustrating a section taken along line AA-AA' of the structure illustrated in FIG. 5.

Referring to FIG. 6, the core pillar CP may be formed at the center of the cell plug CPL, and the channel layer CH may be formed in the shape of a cylinder which encloses the core pillar CP. The tunnel insulating layer Tx may be formed in the shape of a cylinder that encloses the channel layer CH, the charge trap layer CL may be formed in the shape of a cylinder that encloses the tunnel insulating layer Tx, and the blocking layer Bx may be formed in the shape of a cylinder that encloses the charge trap layer CL. The gate line GL may be formed in the shape of a line that encloses the blocking layer Bx.

A method of manufacturing the above-described memory device will be described in detail below.

FIGS. 7A to 7E are views illustrating a method of manufacturing a memory device according to a first embodiment of the present disclosure.

Figure 7A:
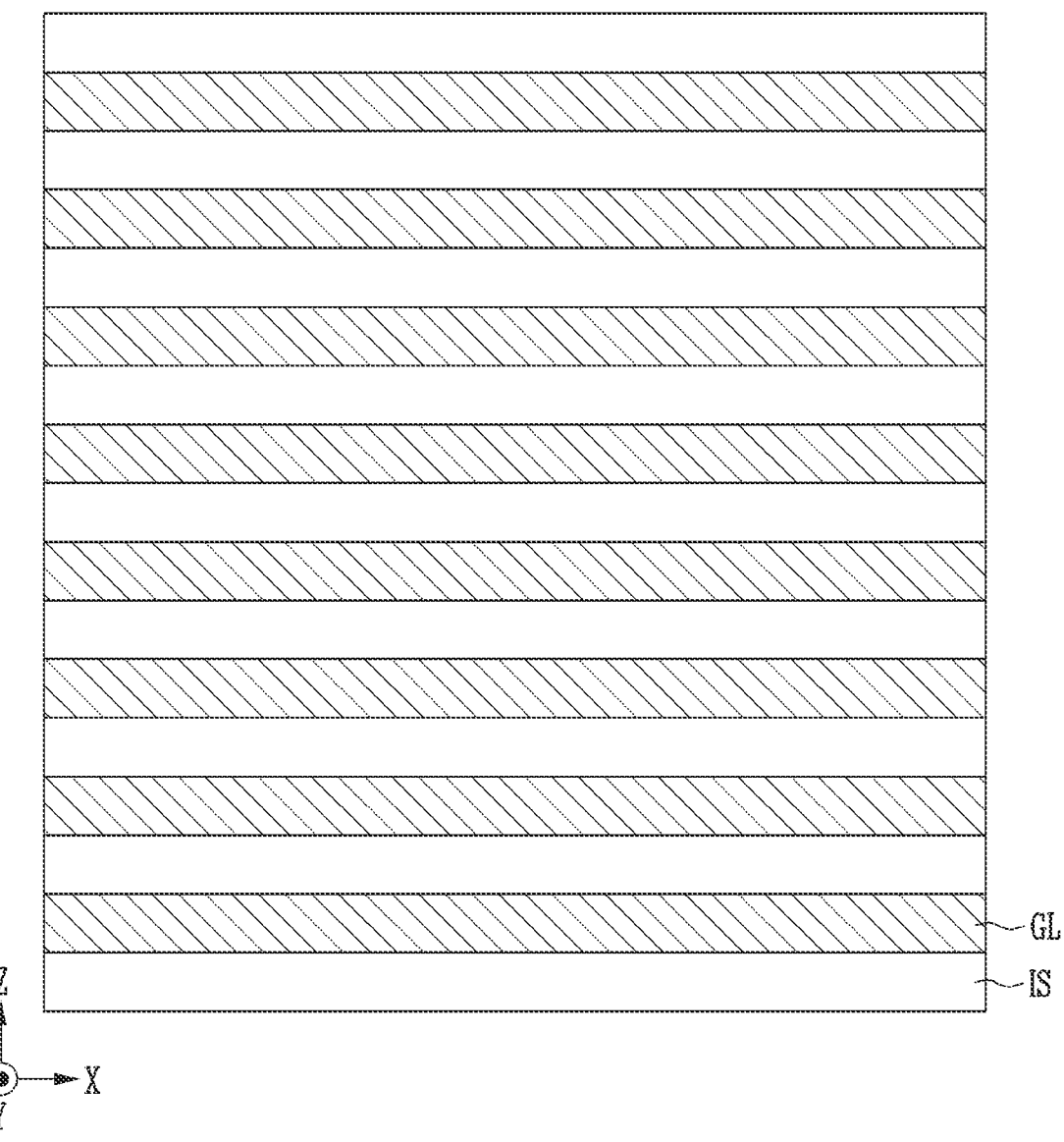
FIGS. 7A to 7E are views illustrating a method of manufacturing a memory device according to a first embodiment of the present disclosure.

Referring to FIG. 7A, insulating layers IS and gate lines GL may be alternately stacked on a lower structure (not illustrated).

Although insulating layers IS and sacrificial layers (not illustrated) are alternately stacked in conventional technology, the first embodiment may be implemented such that the gate lines GL are formed without sacrificial layers being formed. For example, although sacrificial layers (not illustrated) are formed of nitride layers in the conventional technology, the nitride layers are not made of conductive materials, and thus, a process for removing all nitride layers and filling an area from which the nitride layers are removed with a conductive material for the gate lines GL should be performed.

However, in the first embodiment of the present disclosure, gate lines GL, made of a conductive insulating material instead of the sacrificial layers, are formed, and thus, the conventional steps, that is, the step of forming sacrificial layers and the step of removing the sacrificial layers, may be skipped. Also, the ratio of occurrence of defects in which the areas between the insulating layers IS are not filled with a material for the gate lines GL may be decreased.

Figure 7B:
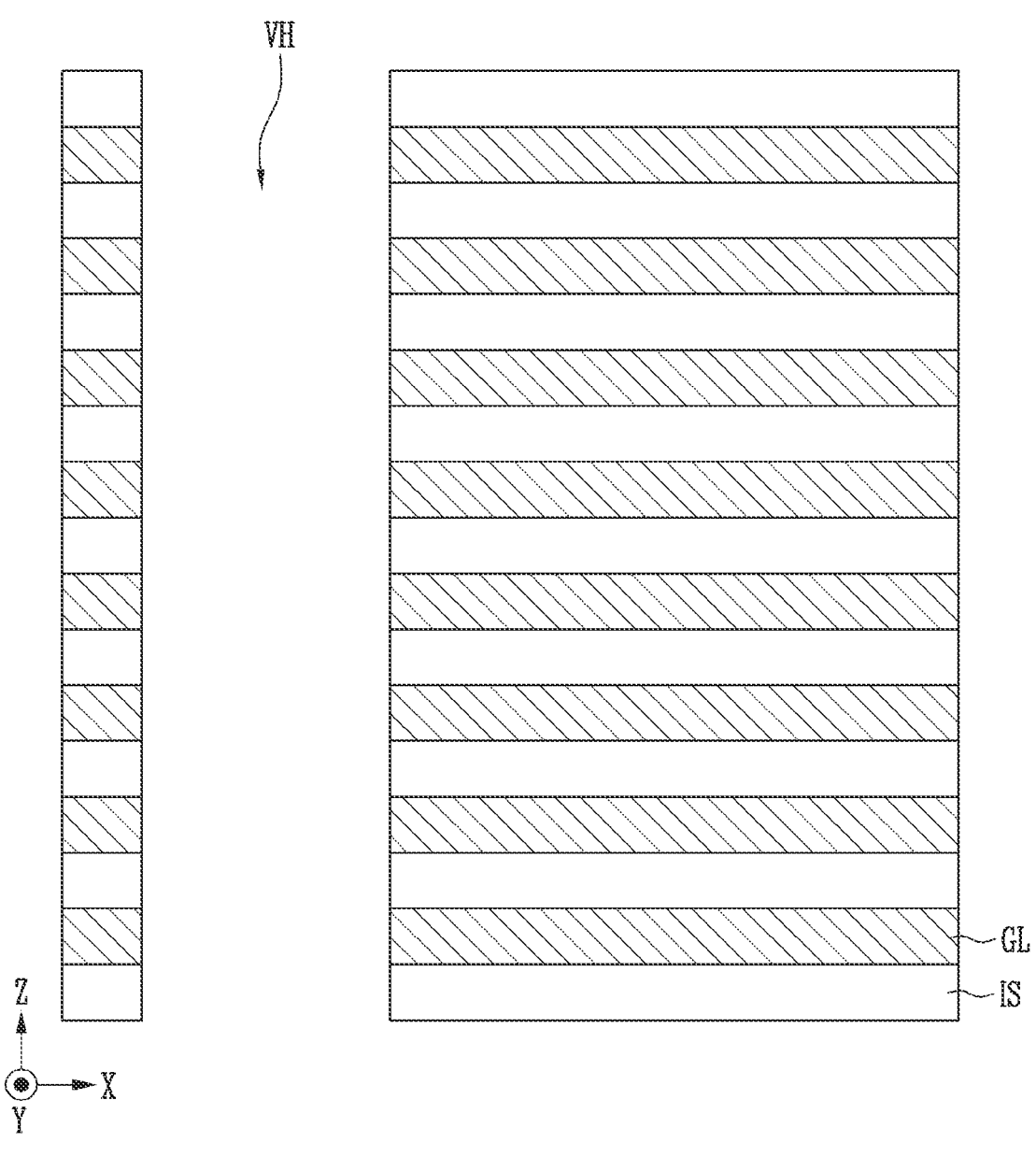

Referring to FIG. 7B, an etching process of forming a vertical hole VH that vertically passes through the insulting layers IS and the gate lines GL may be performed. Because the gate lines GL are made of a material having an etch selectivity similar to that of the insulating layers IS, an etching process for forming the vertical hole VH may be performed in an in-situ method that is executed in the same chamber. The etching process for forming the vertical hole VH may be performed until a lower structure (not illustrated) is exposed. Because the vertical hole VH is a hole that passes through the insulating layers IS and the gate lines GL, the insulating layers IS and the gate lines GL may be exposed through the inner wall of the vertical hole VH.

Figure 7C:
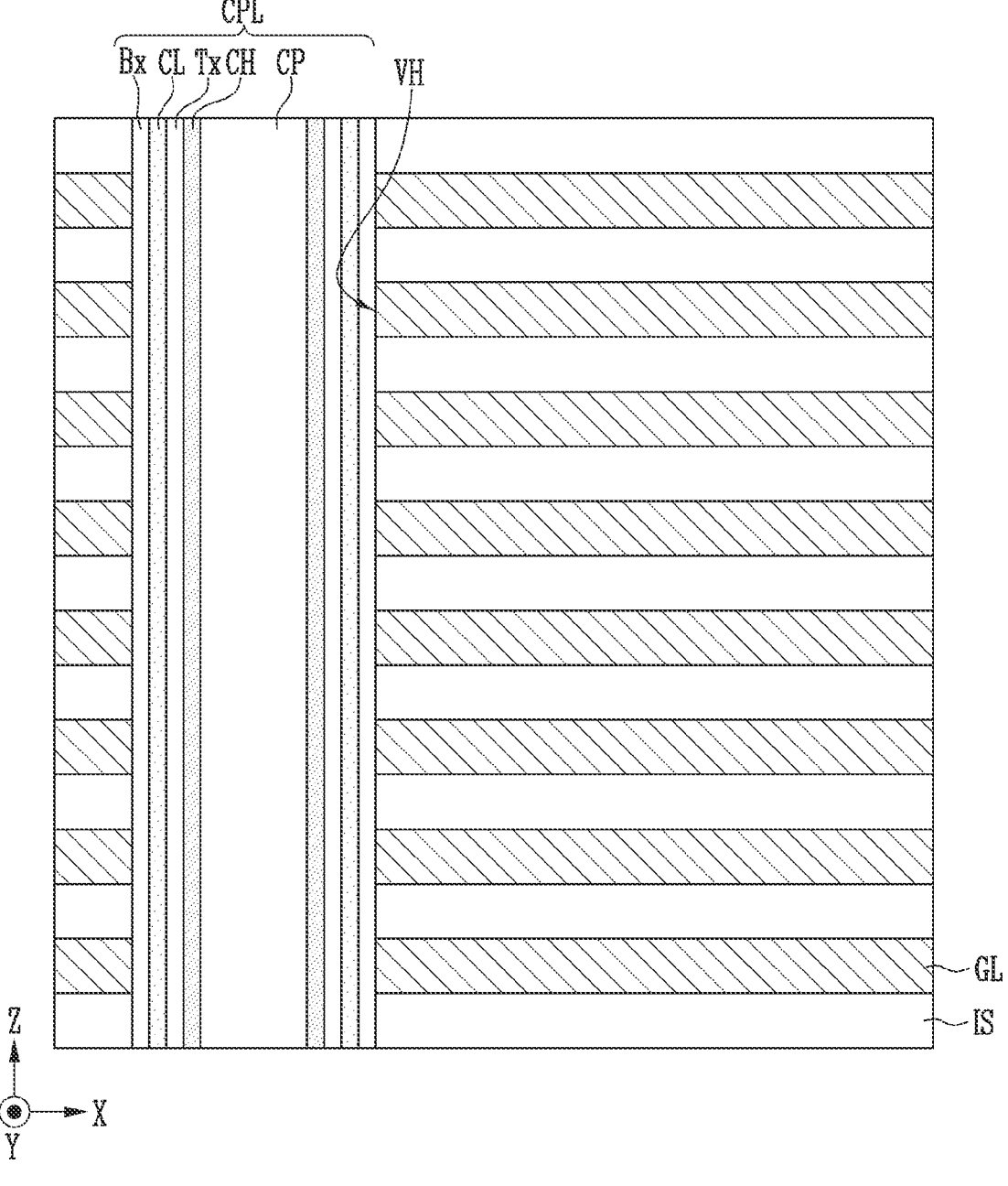

Referring to FIG. 7C, a cell plug CPL may be formed in the vertical hole VH. The cell plug CPL may include a blocking layer Bx, a charge trap layer CL, a tunnel insulating layer Tx, a channel layer CH, and a core pillar CP, which are sequentially formed along an inner wall of the vertical hole VH. For example, the blocking layer Bx may be formed in the shape of a cylinder along the inner wall of the vertical hole VH. The blocking layer Bx may be formed of an oxide layer or a silicon oxide layer. The charge trap layer CL may be formed in the shape of a cylinder along an inner wall of the blocking layer Bx. The charge trap layer CL may be formed of a nitride layer. The tunnel insulating layer Tx may be formed in the shape of a cylinder along an inner wall of the charge trap layer CL. The tunnel insulating layer Tx may be formed of an oxide layer or a silicon oxide layer. The channel layer CH may be formed in the shape of a cylinder along an inner wall of the tunnel insulating layer Tx and may be formed of a nitride layer. The core pillar CP may be formed in the shape of a cylinder that is enclosed with the channel layer CH and may be made of an insulating material or a conductive material.

Figure 7D:
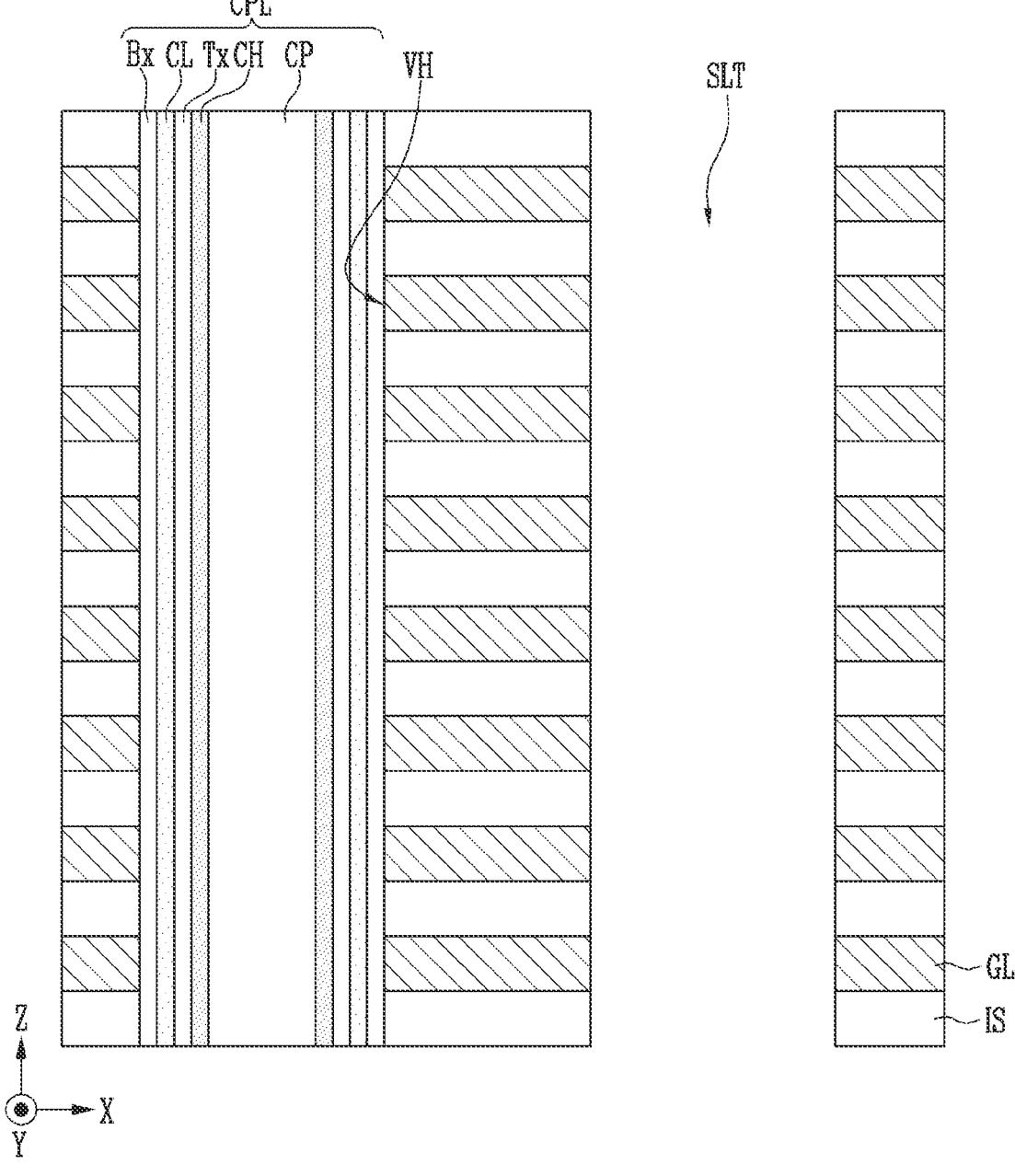

Referring to FIG. 7D, a slit SLT for separating memory blocks may be formed. For example, the slit SLT may be formed through an etching process so that gate lines GL between the memory blocks are separated. The etching process for forming the slit SLT may be performed through a dry etching process. For example, an anisotropic dry etching process may be performed in order to form the slit SLT in a vertical direction Z.

Figure 7E:
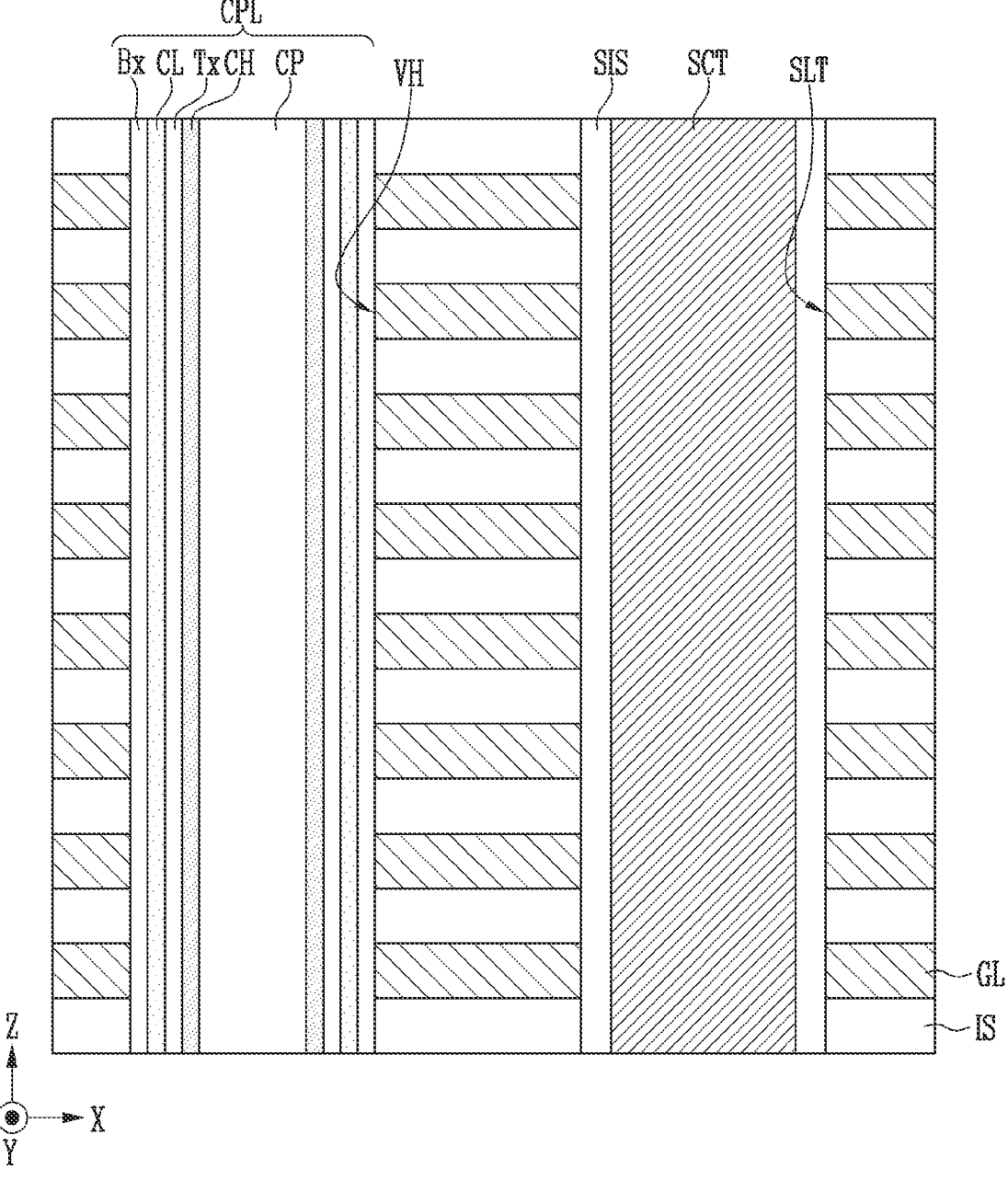

Referring to FIG. 7E, source insulating layers SIS may be formed along a sidewall of the slit SLT, and a source contact SCT may be formed between the source insulating layers SIS. The source contact SCT may be formed of a conductive layer contacting a source line that is included in the lower structure. For example, the source contact SCT may be made of tungsten or polysilicon.

As described above, the step of removing sacrificial layers (not illustrated) after the slit SLT is formed, and the step of filling an area from which the sacrificial layers are removed with a conductive material for gate lines may be skipped, and thus, the method of manufacturing the memory device may be simplified.

Figure 8:
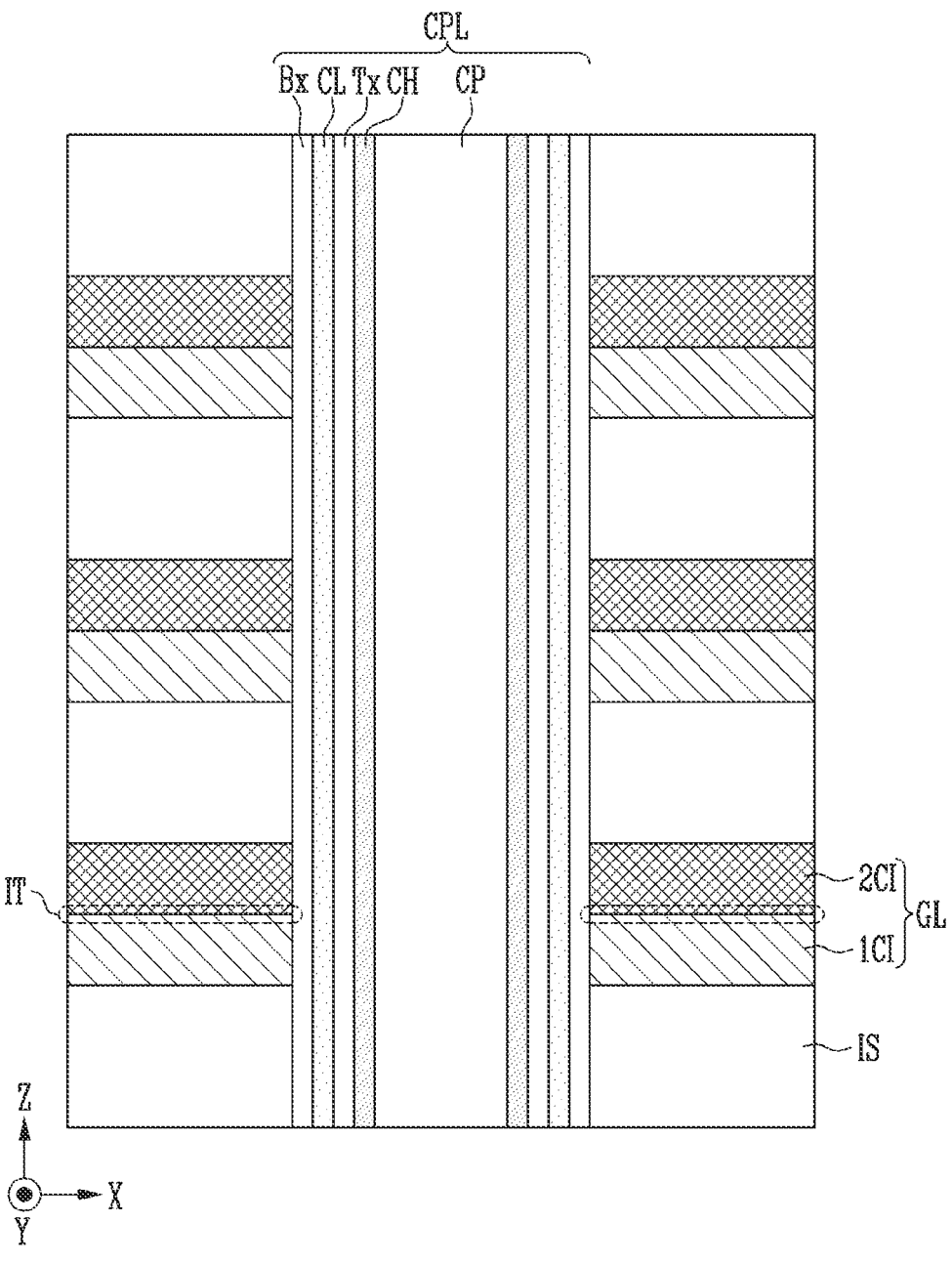
FIG. 8 is a sectional view illustrating the structure of a memory device according to a second embodiment of the present disclosure.
Figure 9:
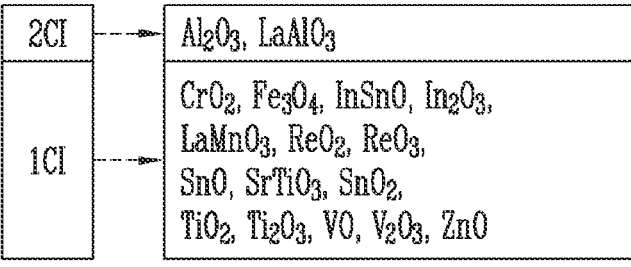
FIG. 9 is a diagram illustrating materials of gate lines according to a second embodiment of the present disclosure.

FIG. 8 is a sectional view illustrating the structure of a memory device according to a second embodiment of the present disclosure, and FIG. 9 is a diagram illustrating materials of gate lines according to a second embodiment of the present disclosure.

Referring to FIGS. 8 and 9, each of gate lines GL may be formed of heterogeneous conductive oxide layers. For example, each of the gate lines GL may be formed of first and second conductive oxide layers 1CI and 2CI. In the second embodiment, although a structure in which each of the gate lines GL is formed of the first and second conductive oxide layers 1CI and 2CI is presented as an example, each gate line GL may be composed of three or more conductive oxide layers. When each gate line GL is composed of different first and second conductive oxide layers 1CI and 2CI, electrical characteristics in an interface IT between the first and second conductive oxide layers 1CI and 2CI may be improved due to different electrical characteristics of the conductive oxide layers. For example, any one of the first and second conductive oxide layers 1CI and 2CI may be made of a material containing aluminum. For example, when the second conductive oxide layer 2CI is made of a material that contains aluminum, the second conductive oxide layer 2CI may be made of $Al_xO_y$, or $La_xAl_yO_z$, and the first conductive oxide layer 1CI may be made of at least one of the remaining conductive oxide materials, such as $Cr_xO_y$, $Fe_xO_y$, $In_xSn_yO_z$, $In_xO_y$, $La_xM-n_yO_z$, $Re_xO_y$, $Re_xO_y$, $Sn_xO_y$, $Sr_xTi_yO_z$, $Sn_xO_y$, $Ti_xO_y$, $V_xO_y$, and $Zn_xO_y$. Here, because x, y, and z denote the number of atoms of an element in a chemical formula, the values of x, y, and z of one chemical formula may be different from the values of x, y, and z of another chemical formula. For example, the second conductive oxide layer 2CI may be made of $Al_2O_3$ or $LaAlO_3$, and the first conductive oxide layer 1CI may be made of at least one of materials, such as $CrO_2$, $Fe_3O_4$, $InSnO$, $In_2O_3$, $LaMnO_3$, $ReO_2$, $ReO_3$, $SnO$, $SrTiO_3$, $SnO_2$, $TiO_2$, $Ti_2O_3$, $VO$, $V_2O_3$, and $ZnO$.

Figure 10:
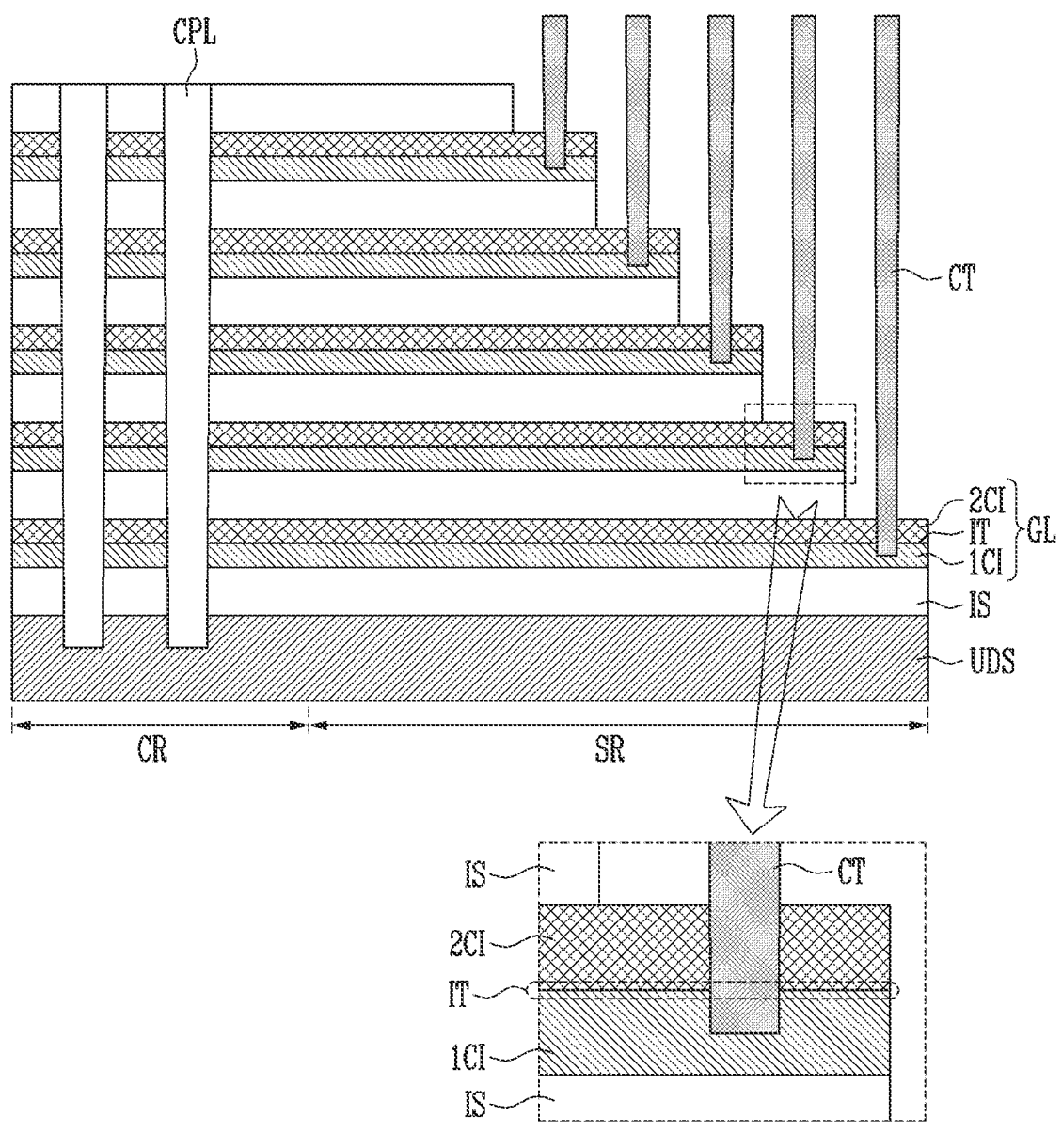
FIG. 10 is a view illustrating a connection structure between gate lines and contacts in a memory device according to a second embodiment of the present disclosure.

FIG. 10 is a view illustrating a connection structure between gate lines and contacts in a memory device according to a second embodiment of the present disclosure.

Referring to FIG. 10, contacts CT for electrically connecting the gate lines GL to a peripheral circuit may be formed in a slim region SR. For example, the insulating layers IS and the gate lines GL may be stacked on a lower structure UDS in which a cell region CR and the slim region SR are defined. In the cell region CR, cell plugs CPL may be formed, and in the slim region SR, the gate lines GL and the insulating layers IS that extend from the cell region CR may be formed in a stepped shape. That is, in the slim region SR, the gate lines GL that extend from the cell region CR may be etched in a stepped shape so that the gate lines GL come into contact with the contacts CT.

Because each of the gate lines GL is formed of the first and second conductive oxide layers 1CI and 2CI in the memory device according to the second embodiment, the contacts CT in the slim region SR may be formed to come into contact with the second conductive oxide layers 2CI, come into contact with the interfaces IT between the second and first conductive oxide layers 2CI and 1CI, or come into contact with the second conductive oxide layers 2CI, the interfaces IT, and the first conductive oxide layers 1CI. Among the examples, it is desired to form the contacts CT to come into contact with the interfaces IT between the second and first conductive oxide layers 2CI and 1CI in order to improve electrical characteristics between the gate lines GL and the contacts CT. For example, the contacts CT may be formed such that the bottom surfaces of the contacts CT come into contact with the interfaces IT between the second and first conductive oxide layers 2CI and 1CI or come into contact with the first conductive oxide layers 1CI.

Figure 11:
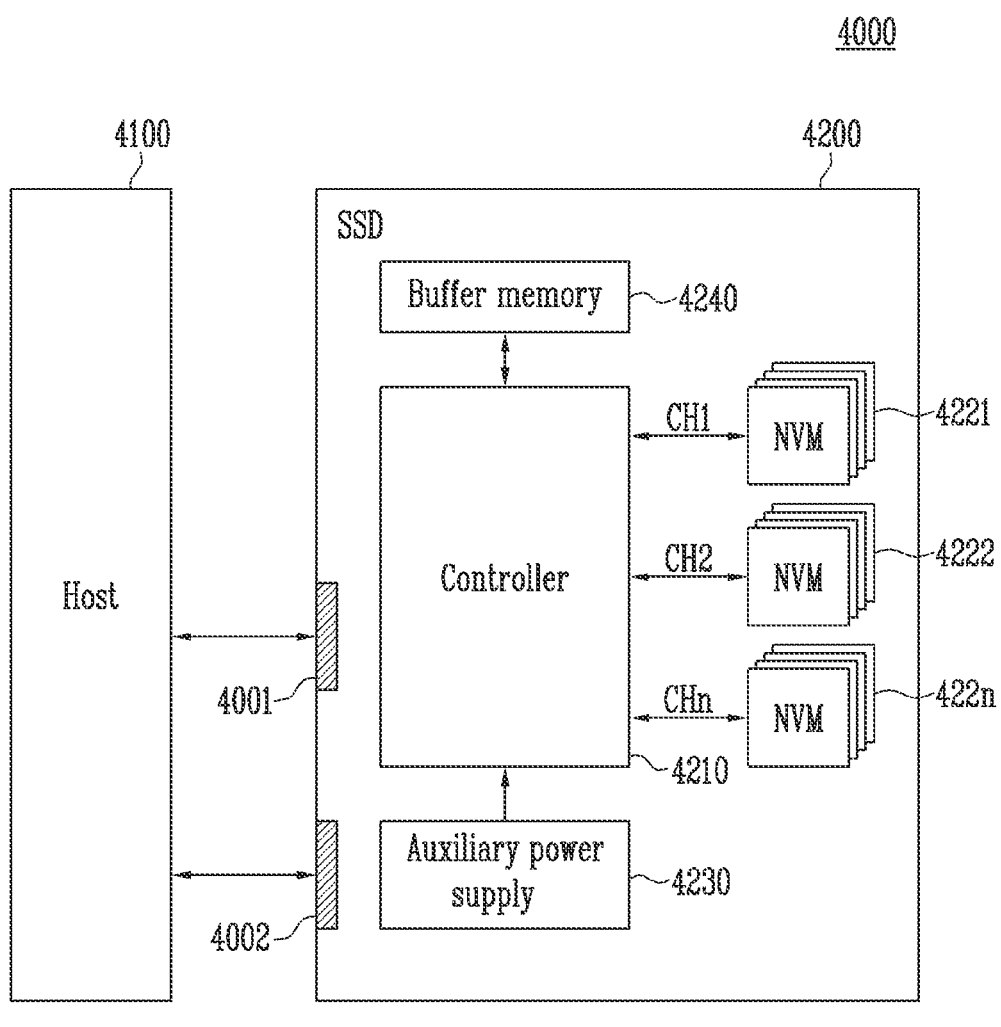
FIG. 11 is a diagram illustrating a solid state drive (SSD) system to which a memory device according to the present disclosure is applied.

FIG. 11 is a diagram illustrating a solid state drive (SSD) system to which a memory device according to the present disclosure is applied.

Referring to FIG. 11, an SSD system 4000 may include a host 4100 and an SSD 4200. The SSD 4200 may exchange signals with the host 4100 through a signal connector 4001 and may be supplied with power through a power connector 4002. The SSD 4200 may include a controller 4210, a plurality of flash memories 4221 to 422$n$, an auxiliary power supply 4230, and a buffer memory 4240.

In accordance with an embodiment of the present disclosure, each of the flash memories 4221 to 422$n$ may be configured in the same manner as the memory device 100, described with reference to FIG. 1.

The controller 4210 may control the plurality of flash memories 4221 to 422$n$ in response to signals, received from the host 4100. In an embodiment, the received signals may be signals based on the interfaces of the host 4100 and the SSD 4200. For example, the signals may be defined by at least one of various interfaces, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and nonvolatile memory express (NVMe) interfaces.

The auxiliary power supply 4230 may be coupled to the host 4100 through the power connector 4002. The auxiliary power supply 4230 may be supplied with a supply voltage from the host 4100 and may be charged with the supply voltage. The auxiliary power supply 4230 may provide the supply voltage to the SSD 4200 when the supply of power from the host 4100 is not smoothly performed. In an embodiment, the auxiliary power supply 4230 may be located inside of the SSD 4200 or located outside of the SSD 4200. For example, the auxiliary power supply 4230 may be located in a main board and may also provide auxiliary power to the SSD 4200.

The buffer memory 4240 may be used as a buffer memory of the SSD 4200. For example, the buffer memory 4240 may temporarily store data that is received from the host 4100 or data that is received from the plurality of flash memories 4221 to 422$n$ or may temporarily store metadata (e.g., mapping tables) of the flash memories 4221 to 422$n$. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

Figure 12:
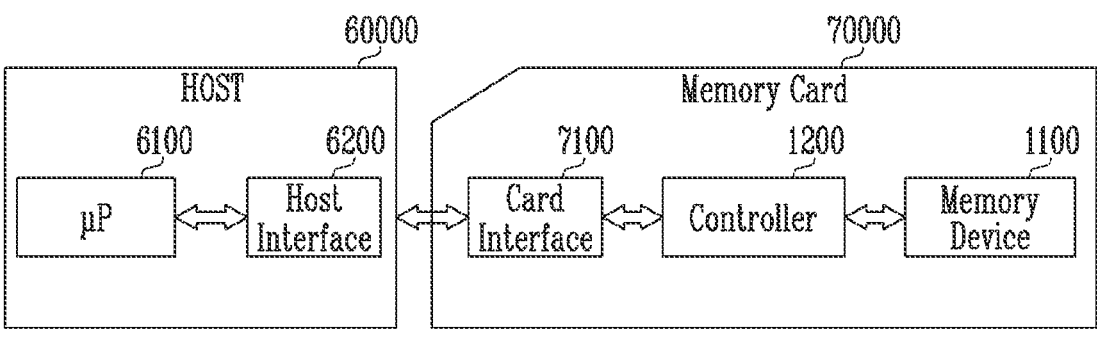
FIG. 12 is a diagram illustrating a memory card system to which a memory device according to the present disclosure is applied.

FIG. 12 is a diagram illustrating a memory card system to which a memory device according to the present disclosure is applied.

Referring to FIG. 12, a memory system 70000 may be implemented as a memory card or a smart card. The memory system 70000 may include a memory device 1100, a controller 1200, and a card interface 7100.

The memory device 1100 may be configured in the same manner as the memory device 100 illustrated in FIG. 1.

The controller 1200 may control data exchange between the memory device 1100 and the card interface 7100. In accordance with an embodiment, the card interface 7100 may be, but is not limited to, a secure digital (SD) card interface or a multi-media card (MMC) interface.

The card interface 7100 may interface data exchange between a host 60000 and the controller 1200 according to the protocol of the host 60000. In accordance with an embodiment, the card interface 7100 may support a universal serial bus (USB) protocol and an interchip (IC)-USB protocol. Here, the card interface 7100 may refer to hardware capable of supporting a protocol which is used by the host 60000, software installed in the hardware, or a signal transmission method.

When the memory system 70000 is coupled to a host interface 6200 of the host 60000, such as a PC, a tablet PC, a digital camera, a digital audio player, a mobile phone, console video game hardware or a digital set-top box, the host interface 6200 may perform data communication with the memory device 1100 through the card interface 7100 and the controller 1200 under the control of a microprocessor (μP) 6100.

In accordance with the present disclosure, the level of difficulty in a process for manufacturing a memory device may be reduced, and the manufacturing process may be simplified.

What is claimed is:

1. A memory device, comprising:
   a plurality of insulating layers and a plurality of gate lines configured to be alternately stacked; and
   a cell plug configured to pass through the plurality of insulating layers and the plurality of gate lines,
   wherein the plurality of gate lines includes a conductive material,
   wherein the plurality of gate lines and the plurality of insulating layers have similar etch selectivity under the same etching gas,
   wherein the cell plug comprises a blocking layer, a charge trap layer, a tunnel insulating layer, a channel layer, and a core pillar, and
   wherein each of the plurality of gate lines is formed of a plurality of different conductive oxide layers.

2. The memory device according to claim 1, wherein each of the plurality of insulating layers is formed of an oxide layer.

3. The memory device according to claim 1, wherein a current flows through the plurality of different conductive oxide layers.

4. The memory device according to claim 1, wherein the plurality of different conductive oxide layers are stacked between the plurality of insulating layers.

5. The memory device according to claim 1, wherein at least one of the plurality of different conductive oxide layers is made of a material that is selected from among the following plurality of chemical formulas: $Al_xO_y$, and $La_x$-$Al_yO_z$, and
   wherein each remaining conductive oxide layer, among the plurality of different conductive oxide layers, is made of at least one material that is selected from among the following plurality of chemical formulas: $Cr_xO_y$, $Fe_xO_y$, $In_xSn_yO_z$, $In_xO_y$, $La_xMn_yO_z$, $Re_xO_y$, $Sr_xTi_yO_z$, $Sn_xO_y$, $Ti_xO_y$, $V_xO_y$, and $Zn_xO_y$.

6. The memory device according to claim 5, wherein values of x, y, and z are numbers indicating a number of atoms of each element in each chemical formula, among the plurality of chemical formulas, and wherein the values of x, y, and z in a chemical formula, among the plurality of chemical formulas, is equal to or different from the values of x, y, and z in another chemical formula, among the plurality of chemical formulas.

\* \* \* \* \*